US 007074051B2

(12) United States Patent
Williams et al.

(10) Patent No.: US 7,074,051 B2
(45) Date of Patent: Jul. 11, 2006

(54) SYSTEM AND METHOD FOR ELECTRICALLY INTERCONNECTING BOARDS

(75) Inventors: Gary Williams, Rowlett, TX (US); Michael McHugh, McKinney, TX (US); Shaun Harris, McKinney, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/779,982

(22) Filed: Feb. 17, 2004

(65) Prior Publication Data

US 2005/0181637 A1 Aug. 18, 2005

(51) Int. Cl.
*H01R 9/09* (2006.01)

(52) U.S. Cl. .......................................... 439/74; 439/487

(58) Field of Classification Search .................. 439/65, 439/74, 487; 361/709, 719
See application file for complete search history.

(56) References Cited

U.S. PATENT DOCUMENTS

| | | | |
|---|---|---|---|
| 5,091,826 A * | 2/1992 | Arnett et al. ............... 361/776 |
| 5,781,414 A | 7/1998 | Mills et al. |
| 5,822,197 A | 10/1998 | Thuault |
| 6,011,319 A * | 1/2000 | Kelly et al. ................ 307/10.1 |
| 6,203,331 B1 | 3/2001 | McHugh et al. |
| 6,238,221 B1 * | 5/2001 | Ikeda et al. ................ 439/76.2 |
| 6,290,514 B1 | 9/2001 | McHugh et al. |
| 6,296,495 B1 | 10/2001 | Wang et al. |
| 6,343,017 B1 * | 1/2002 | Yu et al. ..................... 361/704 |
| 6,409,522 B1 * | 6/2002 | Onizuka ...................... 439/74 |
| 6,585,527 B1 | 7/2003 | Koopman et al. |
| 6,616,461 B1 * | 9/2003 | Bellinghausen et al. ....... 439/68 |
| 6,619,965 B1 * | 9/2003 | Kihira et al. .................. 439/74 |
| 6,781,838 B1 * | 8/2004 | Shinotou ..................... 361/704 |
| 6,781,845 B1 * | 8/2004 | Chang ......................... 361/736 |
| 2002/0106915 A1 * | 8/2002 | Bellinghausen et al. ....... 439/74 |

* cited by examiner

*Primary Examiner*—Thanh-Tam Le

(57) ABSTRACT

A system comprising a first board for electrical communication with a second board, at least one electrical communication connector positioned on one side of said first board, and slots constructed in said first board, said slots adapted for allowing at least one electrical communication connector positioned on said second board to mate through said slots with said first board electrical communication connector.

14 Claims, 2 Drawing Sheets

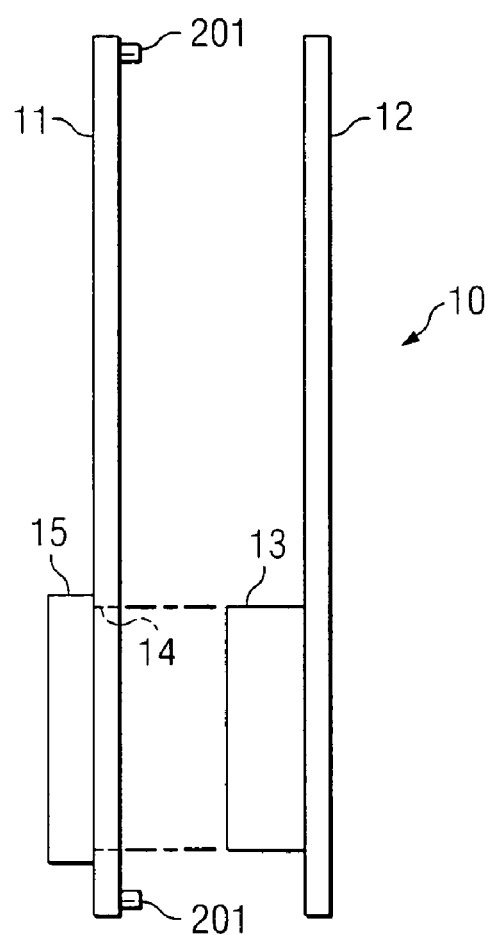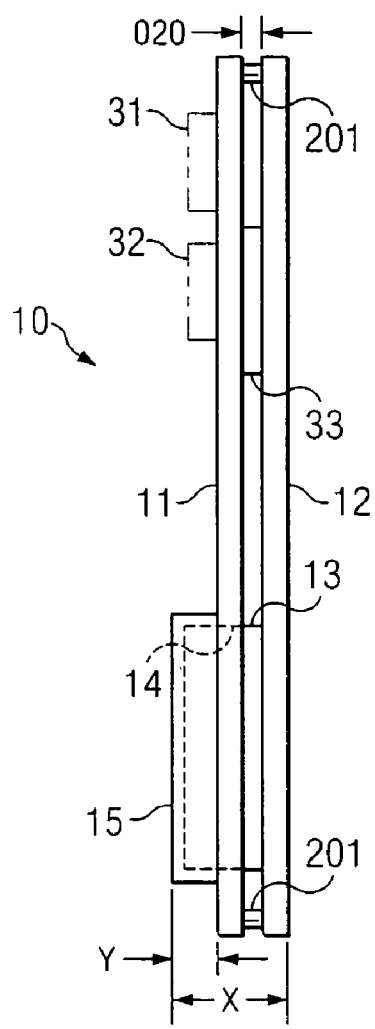

SYSTEM AND METHOD FOR ELECTRICALLY INTERCONNECTING BOARDS

BACKGROUND

In many situations two or more electronic circuit boards are interconnected together by mating connectors. In some situations, blades on one board mate with connectors on a second board. Each blade can carry one or more electrical circuits. These circuits can include data signals and/or power. Heat generated by electronic components on the electronic boards tends to increase as the density of the components increase. Often a limiting factor in circuit design is the amount of heat that can be removed from a given configuration. Typically, the air volume necessary for proper heat removal is proportional to the amount of heat generated.

It is sometimes desired to move circuit boards closer to each other to free up room for heat sinks and other heat management devices. However, when electronic boards are electrically connected, the blade connector that is positioned on one board physically limits how close the two boards can be positioned. This connector then determines the spacing between adjacent boards and limits the cooling options available to a system designer.

BRIEF SUMMARY

In one embodiment a system comprises a first board for electrical communication with a second board, at least one electrical communication connector positioned on one side of said first board, and slots constructed in said first board, said slots adapted for allowing at least one electrical communication connector positioned on said second board to mate through said slots with said first board electrical communication connector.

Another embodiment comprises a system for reducing the space between electronic boards when said electronic boards are electrically connected together using electronic connectors, the system comprising a first electronic board having mounted on a first side thereof at least one said electronic connector, a second electronic board having mounted theron at least one electronic connector adapted to mated with the first board electronic connector, and a slot constructed through the first electronic board to facilitate the mating of the first and second board electronic connectors when the second board is positioned in juxtaposition with a second side of the first electronic board.

Another embodiment comprises a system and method for electrically interconnecting at least two electrical circuits, such that first and second ones of the electrical circuits are positioned such that a first side of a first one of the electrical circuits is positioned parallel to and facing a first side of a second one of the electrical circuits, and at least a portion of electrical connectors positioned on the first side of the second electrical circuit is inserted though the first circuit to mate with electrical connectors positioned on a second side of the first electronic circuit.

Another embodiment comprising a system for increasing cooling capacity of at least two circuit boards interconnected electrically using electrical connectors, the system comprising means for positioning said at least two circuit boards in touching juxtaposition, the means comprising at least one said electrical connector positioned on a side of the first one of said circuit boards opposite the side of the touching juxtapostion, and at least one opening through the first one of the circuit boards, the opening facilitating the electrical interconnecting between the first and second circuit boards.

BRIEF DESCRIPTION OF THE DRAWINGS

FIG. 2 is a side view of the circuit boards shown in FIG. 1 prior to mating; and FIG. 3 is a side view of the circuit boards shown in FIG. 1 in mating relationship;

DETAILED DESCRIPTION

Figure 1:
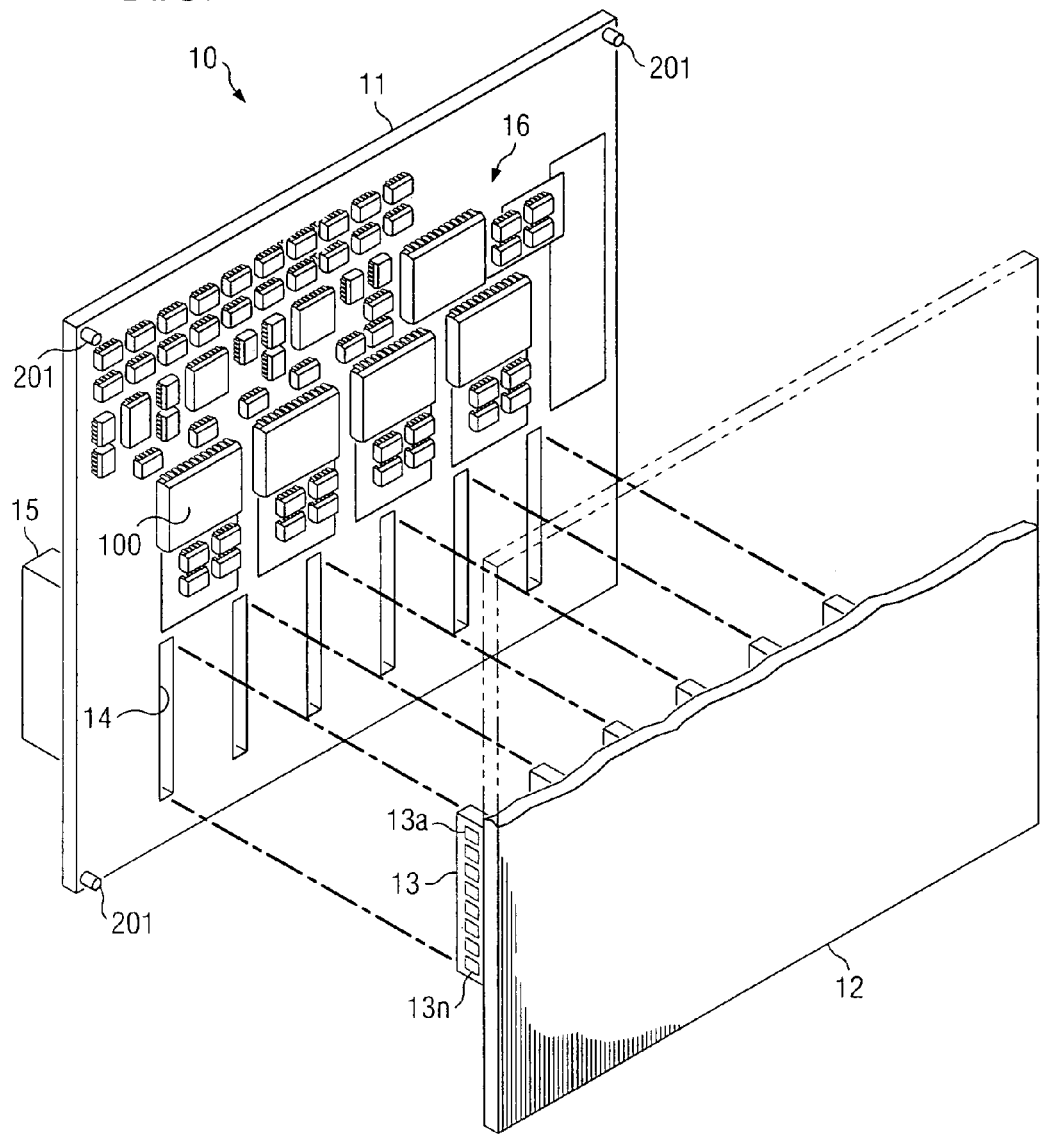
FIG. 1 is a perspective view of one embodiment showing two circuit boards having mating connectors thereon.

FIG. 1 illustrates one embodiment 10 in which a first circuit board 11 has a number of connectors 15 positioned on the backside of the board. In the embodiment shown, connectors 15 are female connectors and the backside is the side away from the side in which a second board 12 is to be connected. In front of each connector 15, a slot 14 is constructed through the board in such a manner that one or more connectors 13 (which in this case are a plurality of parallel spaced apart blade connectors on the face of electronic board 12, FIG. 2) will fit through the slot for mating with connectors 15. In the embodiment shown, board 11 contains one or more circuits 100. The circuits could be, for example, processors. The blade connectors may extend perpendicular, i.e. at 90°, to the face of board 12.

Electronic board 11 (which in the embodiment is a powerboard) sends power to board 12 through one or more blades 13 when board 12 is mated with board 11. In addition to power, bidirectional control signals can be passed back and forth through one or more of blades 13. Power board 11 is shown with stops 201 positioned in the corners to mate against the front plane of board 12. These stops serve to maintain a fixed distance between the two boards when they are mated.

Slots 14 can be constructed in board 11 without regard to the number of connectors 15 that are positioned behind board 11. If desired, each slot can be as wide as desired and thus could allow multiple connectors 13 to fit through each slot. Any number of connectors can be used depending upon the circuits to be mated therewith. The slots can, if desired, be used to guide and or hold blades 13 in position once board 12 is mated against board 11. If desired, a locking mechanism (not shown), such as a latch, velcro, fastener, etc. can be utilized to hold boards 11 and 12 in mating relationship. Each blade 13 can have a plurality of power or signals on contacts 13a–13n thereof. Contacts 13a–13n can be on one or both sides of the blade.

FIG. 2 shows a side view of system 10 in which power board 11 has connector 15 positioned behind slot 14. Electronic board 12 having blade 13 mounted thereon, is shown just prior to mating with power board 11. Blade 13 is about to enter slot 14 for subsequent mating with connector 15.

FIG. 3 shows boards 11 and 12 fully mated with blade connector 13 passed through slot 14 and fully inserted into connector 15. The distance between boards 11 and 12 is shown in the embodiment of FIG. 3 as 0.020 and is controlled by stops 201. This distance can be any desired distance depending upon circuitry and the desired board spacing.

Shown between boards 11 and 12 is heat sink 33. Heat sink 33 can be positioned on board 12 and utilized by both boards 12 and 11 if desired. Also a heat sink, such as heat sink 32, can be positioned as shown with respect to electronic device 31 on the back sides of boards 11 or 12. Other circuitry can also be positioned, if desired on the back side of power board 11, or between boards 11 and 12 or on the back surface of board 12

Since connector 15 is on the back surface of board 11, boards 11 and 12 can be mated in a smaller area than before. This leaves the dimension Y available for additional circuitry or cooling capability. Also, connector 15 can be larger than if it were positioned between boards 11 and 12 and therefore may be made more robust. This robustness reduces manufacturing difficulties and system errors and also allows for increased signaling and power transfer ability between boards 11 and 12.

By way of example, the relative spacing between the embodiment described herein and at least one prior system, is as follows:

|  | Prior System | Embodiment of FIG. 3 |
|---|---|---|
| Total Spacing (X) | 0.44 in. | 0.51 in. |
| Spacing between connected boards | 0.28 in. | 0.02 in. |
| Connector Size | 0.28 in. | 0.33 in. |
| Additional available space (Y) |  | 0.26 in. |

Thus, by increasing the overall size by 0.07 in. (by adding 0.05 in. to the connector dimension and allowing 0.02 in. as fixed spacing) there is gained an additional 0.26 in. for cooling and/or additional equipment. Of course, if connector 15 remains at the size of the old connector (0.28 in), then 0.31 in. are available for cooling on other needs.

Note that while the slots are shown in a vertical orientation, they could also lie in the horizontal plane or any other orientation, provided they match the orientation of the respective board connectors.

What is claimed is:

1. An electronic system, comprising:
   a first circuit board supporting a plurality of blade elements that each include respective electronic circuitry;
   a second circuit board;
   power and control signals distributed by said second circuit board to said plurality of blade elements coupled to said first circuit board;
   said first circuit board being disposed on a first side of said second circuit board;
   said second circuit board comprising a plurality of slots and said plurality of blade elements are coupled through said slots and engage connectors disposed on a second side of said second circuit board; and
   at least one heat sink attached to said first circuit board and contacting electronic components on said second circuit board.

2. The electronic system of claim 1 wherein at least one of said first and second circuit boards comprises stop structures for maintaining a predetermined distance between said first and second circuit boards.

3. The electronic system of claim 1 wherein each blade element comprises a plurality of contacts to receive power and control signals through a respective connector of said second circuit board.

4. The electronic system of claim 1 further comprising:
   a locking mechanism to maintain a physical coupling between said first and second circuit boards.

5. The electronic system of claim 4 wherein said locking mechanism is a latch.

6. An electronic system, comprising:
   means for supporting a plurality of blade elements that each include respective electronic circuitry;
   means for distributing power and control signals to said plurality of blade elements coupled to said means for supporting;
   power and control signals distributed to said plurality of blade elements by said means for distributing;
   wherein said means for supporting is disposed on a first side of said means for distributing, said means for distributing comprises a plurality of slots, and said plurality of blade elements are coupled through said slots and engage connectors disposed on a second side of said means for distributing; and
   means for dissipating heat generated by electronics of said means for distributing, wherein said means for dissipating is attached to said means for supporting.

7. The electronic system of claim 6 wherein at least one of said means for supporting and said means for distributing comprises a plurality of stop structures for maintaining a predetermined distance between said means for supporting and said means for distributing.

8. The electronic system of claim 6 wherein each blade element comprises a plurality of contacts to receive power and control signals through a respective connector of said means for distributing.

9. The electronic system of claim 6 further comprising: means for locking said means for supporting and said means for distributing.

10. An electronic system, comprising:
    a first circuit board supporting a plurality of blade elements that each include respective electronic circuitry;
    a second circuit board for distributing power and control signals to said plurality of blade elements coupled to said first circuit board;
    said first circuit board being disposed on a first side of said second circuit board;
    said second circuit board comprising a plurality of slots and said plurality of blade elements are coupled through said slots and engage connectors disposed on a second side of said second circuit board;
    at least one heat sink attached to said first circuit board and contacting electronic components on said second circuit board; and
    wherein said control signals are bi-directional control signals being one of data signals and power signals that can be passed back and forth through one or more of said blades.

11. The electronic system of claim 10 wherein at least one of said first and second circuit boards comprises stop structures for maintaining a predetermined distance between said first and second circuit boards.

12. The electronic system of claim 10 wherein each blade element comprises a plurality of contacts to receive said control signals through a respective connector of said second circuit board.

13. The electronic system of claim 10 further comprising:
    a locking mechanism to maintain a physical coupling between said first and second circuit boards.

14. The electronic system of claim 13 wherein said locking mechanism is a latch.

* * * * *